(12) United States Patent
Van Herpen et al.

(10) Patent No.: US 7,737,418 B2
(45) Date of Patent: Jun. 15, 2010

(54) DEBRIS MITIGATION SYSTEM AND LITHOGRAPHIC APPARATUS

(75) Inventors: Maarten Marinus Johannes Wilhelmus Van Herpen, Heesch (NL); Wouter Anthon Soer, Nijmegen (NL)

(73) Assignee: ASML Netherlands B.V., Veldhoven (NL)

( * ) Notice: Subject to any disclaimer, the term of this patent is extended or adjusted under 35 U.S.C. 154(b) by 703 days.

(21) Appl. No.: 11/645,808

(22) Filed: Dec. 27, 2006

(65) Prior Publication Data

US 2008/0159471 A1 Jul. 3, 2008

(51) Int. Cl.
*G03F 7/20* (2006.01)
(52) U.S. Cl. .................. 250/492.2; 250/503.1; 378/34
(58) Field of Classification Search ............... 250/492.2
See application file for complete search history.

(56) References Cited

U.S. PATENT DOCUMENTS 3,210,182 A * 10/1965 Funari ..................... 134/5

7,109,503 B1 * 9/2006 Bowering et al. ........ 250/503.1

FOREIGN PATENT DOCUMENTS

| EP | 1 491 963 A2 | 12/2004 |
| EP | 1 491 963 A3 | 8/2005 |

\* cited by examiner

*Primary Examiner*—David A. Vanore
*Assistant Examiner*—Phillip A. Johnston
(74) *Attorney, Agent, or Firm*—Pillsbury Winthrop Shaw Pittman, LLP

(57) ABSTRACT

A debris mitigation system for trapping debris coming from a tin debris-generating radiation source is provided. The debris mitigating system includes a debris barrier comprising a plurality of foils, and a cleaning system constructed and arranged to clean the foils. The cleaning system includes a supply unit to provide a liquid alloy to the foils to dissolve and flush trapped debris from the foils. The alloy includes gallium, indium, tin, or any combination thereof.

21 Claims, 3 Drawing Sheets

DEBRIS MITIGATION SYSTEM AND LITHOGRAPHIC APPARATUS

FIELD

The present invention relates to a debris mitigation system and a lithographic apparatus that includes a debris mitigation system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In addition to Extreme Ultra Violet (EUV) radiation, radiation sources used in EUV lithography tend to generate contaminant material that may be harmful for the optics and the working environment in which the lithographic process is carried out. This is especially the case for EUV sources that operate via a discharge-produced plasma source, such as a plasma tin source. Such a source typically comprises a pair of electrodes to which a voltage can be applied. In addition, a vapor is produced, for example, by a laser beam that is targeted to, for example, one of the electrodes. Accordingly, a discharge will occur between the electrodes, thereby generating a plasma, which causes a so-called pinch in which EUV radiation is produced. In addition to this radiation, the discharge source typically produces debris particles varying in size from atomic to larger than a micrometer, which can be both charged and uncharged. It is desired to limit the contamination of the optical system that is arranged to condition the beams of radiation coming from an EUV source by the debris. Conventional shielding of the optical system primarily includes a system comprising a high number of closely packed foils aligned parallel to the direction of the light generated by the EUV source. A so-called foil trap, for instance, as disclosed in EP1491963 uses a high number of closely packed foils aligned generally parallel to the direction of the light generated by the EUV source. Contaminant debris, such as micro-particles, nano-particles and ions can be trapped in walls provided by the foil plates. Thus, the foil trap functions as a contamination barrier that traps contaminant material from the source. Due to the arrangement of the platelets the foil trap is transparent for light, but will capture debris, either because the debris is not traveling parallel to the platelets, or because of a randomized motion caused by a buffer gas. For contamination barriers in an EUV apparatus that are exposed to contamination from a tin debris generating radiation source over time, a desire exists to provide a cleaning method, since the barriers will be contaminated with captured debris, which may impede the radiation transmissive properties of the barrier.

SUMMARY

According to an aspect of the invention, there is provided a debris mitigation system for trapping debris coming from a tin debris-generating radiation source. The debris mitigating system includes a debris barrier comprising a plurality of foils, and a cleaning system constructed and arranged to clean the foils. The cleaning system includes a supply unit to provide a liquid alloy to the foils to dissolve trapped debris and flush the trapped debris from the foils. The alloy includes gallium, indium, tin, or any combination thereof.

According to an aspect of the invention, a lithographic apparatus is provided. The lithographic apparatus includes a patterning device constructed and arranged to pattern a beam of radiation, a projection system constructed and arranged to project the patterned beam of radiation onto a substrate, and a debris mitigation system constructed and arranged to trap debris coming from a tin debris-generating radiation source. The debris mitigating system includes a debris barrier that includes a plurality of foils, and a cleaning system constructed and arranged to clean the foils. The cleaning system includes a supply unit constructed and arranged to provide a liquid alloy to the foils to dissolve trapped debris and flush the trapped debris from the foils. The alloy includes gallium, indium, tin, or any combination thereof.

According to an aspect of the invention, there is provided a method of cleaning an optical component in an EUV apparatus exposed to radiation from a tin debris-generating radiation source. The method includes providing an alloy to the surface of the component to dissolve and flush debris from said component. The alloy includes gallium, indium, tin, or any combination thereof.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
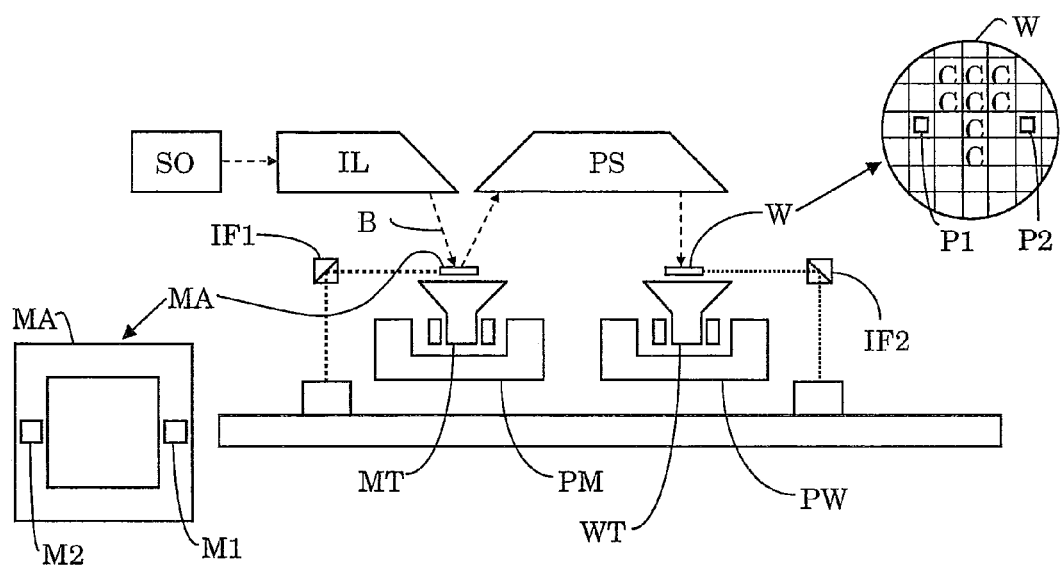
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive or reflective projection lens system) PS configured to project a pattern imparted to the radiation beam B by patterning device MA onto a target portion C (e.g. comprising one or more dies) of the substrate W.

The illumination and projection system may include various types of optical components, such as refractive, reflective, diffractive or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example, if the pattern includes phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, or any combination thereof, as appropriate for the exposure radiation being used. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A problem with foil traps in Sn-based EUV sources is the tendency for the space between subsequent foils to become filled with Sn. If the Sn layer becomes too thick, the foil trap may lose transmission. Thus, after a certain operation time, the foil trap will typically be cleaned or replaced. Preferably, the foil trap may be cleaned without having to take the foil trap out of the system. The solution proposed herein is to clean the foil trap using a liquid alloy of gallium, indium, or tin, or any combination thereof, generally indicated as Ga—In—Sn alloy. The alloy may be provided with such a composition that it is liquid at the temperature used, which is typically room temperature. Preferably, but not necessarily, this alloy is provided as a eutectic alloy. In another embodiment, the alloy is provided free from tin, so that more tin contamination can dissolve in the alloy of gallium and indium. The amount of tin that can dissolve into the alloy is limited by the liquidus in the phase diagram, and as such depends on the starting composition of the alloy and the temperature.

Figure 2:
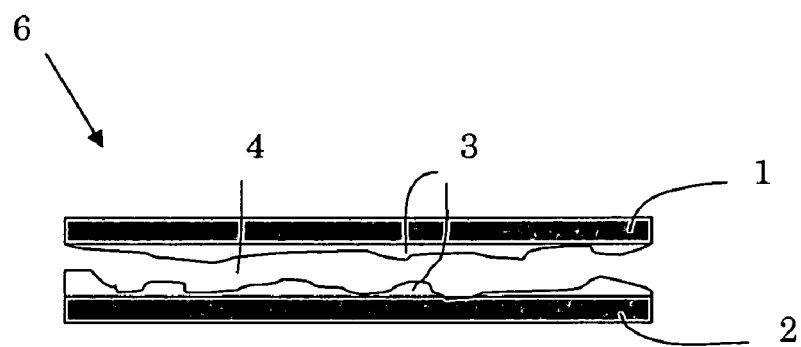
FIG. 2 shows a schematic illustration of tin debris contaminating foils of a foil trap.

Because this alloy is liquid at room temperature, it should easily flow through the foil trap, while dissolving the Sn that is present on the platelets. As shown in FIG. 2, space between subsequent foils of a foil trap 6 (schematically illustrated in FIG. 3) may become filled with Sn. This problem is illustrated in FIG. 2, which shows two foils 1 and 2 from a foil trap, with an aperture 4 in between these foils. While Sn debris particles are captured by the closely packed foils, the EUV light can travel through the aperture 4, and further downstream into the EUV lithography tool. However, since the Sn debris is captured by the foils 1 and 2, these foils may become coated with a layer of Sn 3, as shown in FIG. 2.

If the Sn layer 3 becomes too thick, the EUV light may no longer be able to pass through the aperture 4 unhindered. Thus, after a certain operation time, the foil trap may need to be cleaned, or replaced. Preferably, the foil trap is cleaned without having to take the foil trap out of the system.

Figure 3:
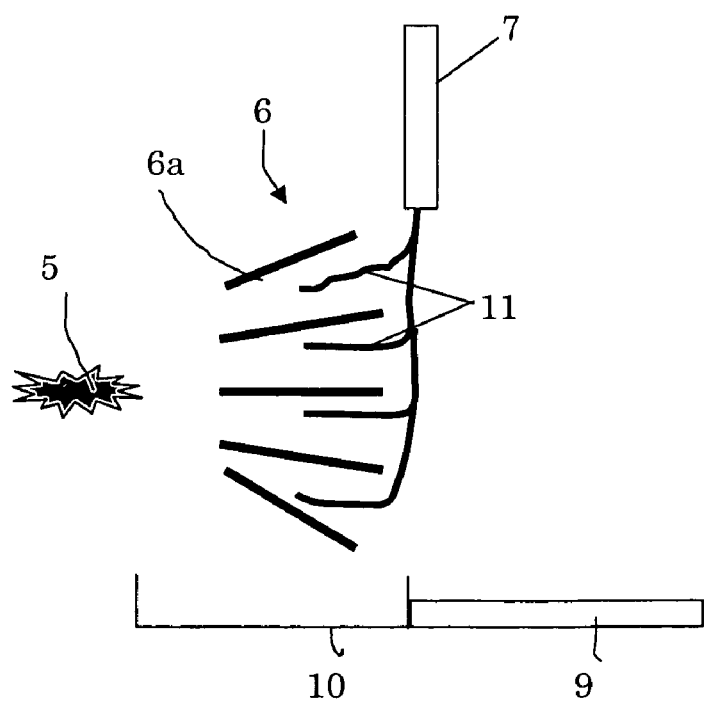
FIG. 3 shows a basic embodiment of a debris mitigation system of the lithographic apparatus of FIG. 1 according to an embodiment of the present invention.

FIG. 3 shows schematically a basic embodiment according to an aspect of the invention, comprising an EUV source 5, a foil trap 6 (with foils 6a), and a cleaning system, represented by reference numbers 7, 9, 10, 11. The cleaning system includes an inlet 7 that is constructed and arranged to supply a Ga—In—Sn alloy 8 to the foils 6a, and an outlet 9 for the Ga—In—Sn alloy 8. The cleaning system may further be equipped with a collection cup 10 for the Ga—In—Sn alloy 8 and tubes 11 for bringing the Ga—In—Sn alloy between the foils 6a of the foil trap 6. The tubes 11 may be in the form of injectors that are configured to inject the alloy under pressure between the foils 6a.

Using this embodiment, the Ga—In—Sn alloy can be introduced into the space between the foils 6a. Upon contact with the Ga—In—Sn alloy, the Sn on the foils will dissolve into this alloy. Next, the alloy will flow out of the foils via the outlet 9, thereby re-opening the space between the foils. One major advantage of using the Ga—In—Sn alloy compared to pure liquid Sn is that the alloy is liquid at room temperature, which should eliminate the need to heat the foil trap and/or the liquid during cleaning. However, such heating may still be applied in order to increase the dissolution rate and thereby reduce the cleaning time.

Preferably, no oxygen is present during the cleaning treatment (see below). Oxygen may react with the gallium in the Ga—In—Sn alloy to form gallium oxide, which may contaminate the foils of the foil trap and inhibit the dissolution of the tin into the alloy. The presence of gallium oxide can be prevented in several ways. For example, the cleaning may be completed in an argon environment that is low in oxygen concentration. In another example, the cleaning may be performed in a vacuum. Because the EUV tool already has a vacuum, this latter example is preferred, although not necessary.

The alloy does not wet very easily on a Mo foil, which may make it difficult to let the liquid flow through the channels between subsequent foils of the foil trap. Thus, in an embodiment, the Ga—In—Sn alloy is forced through these channels using pressure. This can be done by connecting the tubes 11 directly to the channels between the foils and then pushing the Ga—In—Sn alloy through the channels using a small pressure.

Experimentally it was found that it is preferable to reduce the tin oxide to tin, prior to applying the Ga—In—Sn alloy, so that the tin oxide does not inhibit the dissolution process. Additionally, the removal of oxides facilitates the wetting of the Ga—In—Sn alloy on the surface and thus may improve the cleaning efficiency. The reduction of the tin oxide may be done in several ways, for example, by using hydrogen radicals. These hydrogen radicals will react with the oxygen to form water, leaving pure Sn behind.

Thus, in a preferred embodiment, the embodiment shown in FIG. 3 is further equipped with a source for hydrogen radicals (not shown in the Figures). In order to clean the foils, the foil trap is first exposed to hydrogen radicals for a duration of, for example, 5 minutes. Subsequently, the Ga—In—Sn alloy is applied to the foils, dissolving the Sn.

Other techniques may be used to reduce the tin oxides, such as, for example, a wet reduction method using a chemical reductor, or, for example, a catalytic cleaning method using hydrogen molecules.

The technique described in this invention may also be used to clean other components that are contaminated by tin, for example EUV mirrors.

Figure 4:
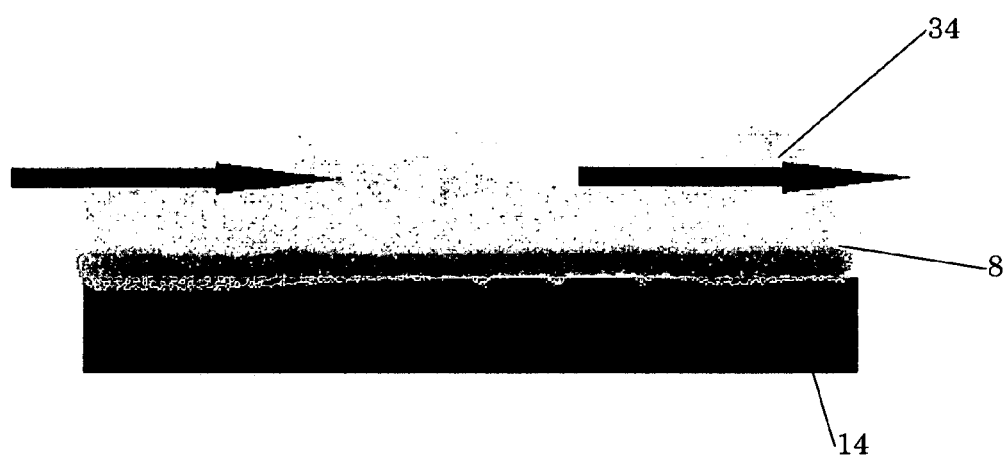
FIG. 4 shows a schematic illustration of a surface of the lithographic apparatus being cleaned according to an embodiment of the invention.

FIG. 4 shows a general schematic illustration of the cleaning principle explained hereabove with reference to FIG. 2. In particular, a platelet 14 is heated, so that debris 8 deposited thereon will be evaporated. By providing a flow of the Ga—In—Sn alloy 34 along the platelet 14, the tin debris 8 will be dissolved and carried away from the platelet, by which the platelet can be cleaned. In FIG. 4, the object to be cleaned (a platelet 14 or mirror optic) may be heated while the Ga—In—Sn alloy is flowing over the mirror in order to increase the dissolution rate of the tin into the alloy. Heating can be done with a heating device, but it is also possible to temporarily reduce active cooling of the object, and use the heat generated by the EUV source.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. A debris mitigation system for trapping debris coming from a tin debris-generating radiation source, the debris mitigating system comprising:
    a debris barrier comprising a plurality of foils; and
    a cleaning system constructed and arranged to clean the foils, said cleaning system comprising a supply unit to provide a liquid alloy to said foils to dissolve and flush trapped debris from said foils, the alloy comprising gallium, indium, tin, or any combination thereof.

2. A debris mitigation system according to claim 1, wherein the debris comprises tin.

3. A debris mitigation system according to claim 1, wherein the supply unit is arranged to provide said alloy with a composition that is liquid at room temperature.

4. A debris mitigation system according to claim 1, wherein the supply unit is arranged to provide said alloy as an eutectic alloy.

5. A debris mitigation system according to claim 1, wherein the supply unit is arranged to provide said alloy free from tin.

6. A debris mitigation system according to claim 1, wherein the cleaning system further comprises a collection cup provided to collect the alloy.

7. A debris mitigation system according to claim 1, wherein the cleaning system further comprises an injector to inject the alloy under pressure between the foils.

8. A debris mitigation system according to claim 1, further comprising a second supply unit constructed and arranged to administer a reductor material.

9. A debris mitigation system according to claim 1, further comprising a discharge-produced or a laser-produced plasma source.

10. A debris mitigation system according to claim 9, wherein said plasma source comprises tin, lithium, or xenon.

11. A debris mitigating system according to claim 1, further comprising a collector element.

12. A debris mitigating system according to claim 11, wherein said collector element is cylindrically symmetric and comprises concentrically curved reflective surfaces.

13. A lithographic apparatus comprising:
    a patterning device constructed and arranged to pattern a beam of radiation;
    a projection system constructed and arranged to project the patterned beam of radiation onto a substrate; and
    a debris mitigation system constructed and arranged to trap debris coming from a tin debris-generating radiation source, the debris mitigating system comprising
    a debris barrier comprising a plurality of foils; and
    a cleaning system constructed and arranged to clean the foils, the cleaning system comprising a supply unit constructed and arranged to provide a liquid alloy to said foils to dissolve and flush trapped debris from said foils, the alloy comprising gallium, indium, tin, or any combination thereof.

14. A lithographic apparatus according to claim 13, wherein the trapped debris comprises tin.

15. A method of cleaning an optical component in an EUV apparatus exposed to radiation from a tin debris-generating radiation source, the method comprising:
    providing an alloy to the surface of said component, to dissolve debris so as to flush the debris from said component, said alloy comprising gallium, indium, tin, or any combination thereof.

16. A method according to claim 15, wherein the debris comprises tin.

17. A method according to claim 15, wherein said alloy is supplied as an eutectic alloy.

18. A method according to claim 15, wherein said alloy is supplied free from tin.

19. A method according to claim 15, further comprising reducing tin oxides to tin with a reductor.

20. A method according to claim 19, wherein said reductor comprises hydrogen radicals.

21. A method according to claim 15, wherein said optical component is a contamination barrier comprising a plurality of foils.

* * * * *